(12) United States Patent
Van De Walle et al.

(10) Patent No.: US 7,282,769 B2
(45) Date of Patent: Oct. 16, 2007

(54) THIN FILM TRANSISTOR DEVICE AND METHOD OF MAKING THE SAME

(75) Inventors: Gerjan Franciscus Arthur Van De Walle, Eindhoven (NL); Andreas Hubertus Montree, Leuven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 279 days.

(21) Appl. No.: 10/492,331

(22) PCT Filed: Oct. 10, 2002

(86) PCT No.: PCT/IB02/04169

§ 371 (c)(1),
(2), (4) Date: Apr. 9, 2004

(87) PCT Pub. No.: WO03/034502

PCT Pub. Date: Apr. 24, 2003

(65) Prior Publication Data

US 2004/0245519 A1 Dec. 9, 2004

(30) Foreign Application Priority Data

Oct. 11, 2001 (EP) .................................. 01203855

(51) Int. Cl.
*H01L 23/62* (2006.01)
(52) U.S. Cl. .................................. 257/359; 257/E27.1
(58) Field of Classification Search ................ 438/149, 438/151; 257/E51.005, E29.151
See application file for complete search history.

(56) References Cited

U.S. PATENT DOCUMENTS 6,982,194 B2 * 1/2006 Tsunoda et al. ............ 438/157
7,122,835 B1 * 10/2006 Ikeda et al. .................... 257/72

* cited by examiner

*Primary Examiner*—Scott B. Geyer
(74) *Attorney, Agent, or Firm*—Adam L. Stroud

(57) ABSTRACT

The electronic device comprises a thin-film transistor (10) and can be obtained from two substrates (1, 11). In order to preclude delamination at a non-adhesive interface between a metal pattern (24, 29) and an organic layer (4), the metal pattern (24, 29) comprises apertures (30). Through these apertures (30), adhesion between the organic layer (4, 5) and organic material at the surface (111) of one of the substrates (11) can be brought about. The electronic device can be manufactured by use of microcontact printing.

10 Claims, 4 Drawing Sheets

THIN FILM TRANSISTOR DEVICE AND METHOD OF MAKING THE SAME

The invention relates to an electronic device comprising a base substrate provided with a surface at which a first electrode layer of a metal is present, a channel layer of a semiconductive material, an intermediate layer of a dielectric material, and an adhesive substrate provided with a surface of an organic material at which a second electrode layer of a metal is present, in which electrode layers, channel layer and intermediate layer a thin-film transistor is defined; which electronic device can be obtained by laminating together the substrates provided with layers. The invention also relates to a method of manufacturing such an electronic device.

Such an electronic device is known from U.S. Pat. No. 6,197,663. The known device is manufactured by laminating together the base substrate, at least one electrode layer and the adhesive substrate. Said adhesive substrate may include an interconnect layer or an electrode layer.

If the adhesive substrate comprises an interconnect layer, the thin-film transistor is situated on the base substrate prior to the laminating operation. The source electrode and the drain electrode are provided with contact surfaces that are larger than the source and drain electrodes. As the interconnect layer comprises structures in the order of magnitude of 50 to 250 micrometers, and contact surfaces in the first electrode layer probably are comparable in size, the electrode layers can be readily aligned.

Research leading to the invention in question has shown, however, that the method does not automatically yield a functional electronic device if the adhesive substrate comprises an electrode layer. This can be attributed to the fact that delamination of the adhesive substrate comprising the electrode layer occurs if the electrode layer contains a metal. Said metal is necessary, however, to provide for good conducting properties.

The embodiment wherein the device is built up from two substrates has the advantage, however, that it can be manufactured by providing a number of organic materials layer by layer from the solution by means of, for example, spincoating after the metal layers have been applied to the substrates.

Therefore, a first object of the invention is to provide an electronic device of the type mentioned in the opening paragraph, which can be manufactured from two substrates without delamination taking place.

The first object is achieved in that:

the second electrode layer comprises a conductive surface and the conductive surface has an opening where adhesion occurs between the organic material at the surface of the adhesive substrate and the organic material of one of the layers chosen from intermediate layer, channel layer and surface of the base substrate.

It has been found that two layers of organic material adhere well to one another, whereas the metal adheres poorly to the organic material. By defining openings in the metal, the distance over which no adhesion occurs is reduced. This is important, in particular, in the case of the conductive surfaces having a large surface area of at least 5 micrometers by 5. Examples of such surfaces are a gate electrode, a contact surface for a via and a picture electrode. The distance between two openings, or between an opening and an edge of a (contact) surface, favorably is less than 5 micrometers, and preferably less than 2 micrometers.

In a favorable embodiment, a source and a drain electrode are defined in the first electrode layer, which source electrode and drain electrode are separated by a channel that is filled with the channel layer. In this embodiment, the conductive surface in the second electrode layer is defined as the gate electrode, which, in the case of a perpendicular projection on the first electrode layer, overlaps the channel. In this embodiment, the semiconductor device is laminated by providing the intermediate layer on the second electrode layer with the gate electrode. In this manner, improper adhesion of the interface between the channel layer and the first electrode layer is precluded. In addition, adhesion-improving additives, such as thiols, can be added to the intermediate layer without the action of the semiconductor in the channel layer being influenced. Besides, this enables an inorganic semiconductor, such as CdSe and amorphous Si, to be chosen. Examples of organic semiconductor materials are, inter alia, polyalkylthiophenes, pentacene, oligothiophenes, polythienylenevinylene, polyarylamines. These and other materials, as well as methods of preparing them and application techniques are known to persons skilled in the art of conductive polymers and oligomers.

In a further embodiment, the source electrode and the drain electrode in the first electrode layer are an interdigitated electrode pair, and the gate electrode is overdimensioned with respect to the interdigitated electrode pair. In this manner, the openings in the gate electrode can be integrated relatively readily without the gate electrode no longer fully overlapping the channel (in the case of a perpendicular projection of the gate electrode on the first electrode layer). Said overdimensioning creates some clearance for aligning the adhesive substrate and the base substrate with respect to each other.

In another embodiment, the first electrode layer comprises a contact surface, a projection of the conductive surface in the second electrode layer on the first electrode layer overlapping with the contact surface in the first electrode layer. In this embodiment, the channel layer and the intermediate layer are at least substantially absent at the location of the contact surfaces, so that both surfaces are electroconductively interconnected. In this manner, the conductive surface in the second electrode layer forms part of a via.

To pattern the organic semiconductor use can be made of various techniques. In a first embodiment, a composition of a carrier material, an organic semiconductor and a photosensitive component are provided. Subsequently, the composition is dried, resulting in the formation of the channel layer. This channel layer is photolithographically patterned. In a second embodiment, a precursor polymer of an organic semiconductor, such as polyvinylthienylene vinylene, is provided. The precursor polymer is exposed before being converted to the organic semiconductor. After conversion, the exposed parts of the channel layer are removed by washing the layer in a suitable solvent, such as chloroform. In a third embodiment, printing, in particular ink jet printing, is used for patterning.

It is additionally favorable to provide aligning means. A favorable example of such aligning means are insulated, i.e. without electrical function, tracks in the first and the second metal layer. These aligning means can particularly suitably be used in the assembly operation to make sure that both substrates are at the same tension, i.e. one substrate is not stretched more than the other.

It is favorable, in particular, if, instead of the surface of the adhesive substrate containing an organic material, both substrates are foils made of a polymeric material. Such foils have the advantage that they are flexible. In addition, they are commercially available with a metallization, so that the electrode layers do not have to be separately provided. In a further embodiment, an interconnect layer of an electroconductive material, an electrically insulating layer provided with at least one vertical interconnect, and the second electrode layer are successively present on one side of the second substrate. If very many vias are necessary, it may be advantageous to provide an additional interconnect layer. Essentially, this means that two metallized substrates are arranged one on top of the other, with the electroconductive layers being electrically interconnected by means of vias. The metallized substrates may also be printed circuit boards, which are more or less flexible. Also in this case, the via is the normative dimension for aligning. Possibly, such an interconnect layer is situated on the side of the first substrate. If an optical means is used for aligning the first half of the semiconductor device with respect to the second half of the semiconductor device, then preferably only one of said halves is provided with an interconnect layer.

In a further embodiment, a protection layer that blocks radiation having a wavelength between 700 and 850 nm, preferably between 400 and 850 nm, is integrated in at least one of the substrates. It has been found that the action of light and oxygen causes an organic semiconductor to be doped and hence the on/off ratio of the transistor to be reduced. By protecting the channel layer against said action, in particular in the channel between the source and the drain electrode, the service life of the transistor is increased. The protection layer comprises, for example, carbon black or titanium nitride.

To manufacture the electronic device in accordance with the invention, it is favorable if, prior to the lamination of the device, the adhesive substrate and the base substrate form part of the same encapsulating layer. Lamination of the device takes place by folding in two the encapsulating layer along a folding line. This method has the advantage that the electronic device is directly provided with a protective layer. In addition, it renders aligning at right angles to the folding line superfluous. For this embodiment it is necessary, however, that the first and the second electrode layer are provided in an alternating pattern on the encapsulating layer. Furthermore, the channel layer must be structured, which can be achieved by means of a resist, ink jet printing or otherwise. For this reason, this embodiment is particular favorable if, apart from the transistor, the electronic device comprises other components of comparatively large dimensions, such as a capacitor, or a pixel. Examples of such electronic devices are a transponder and a display device of the active-matrix LCD type.

To manufacture the electronic device in accordance with the invention, use can also suitably be made of microcontact printing to pattern the electrode layers. As is known, in accordance with this technique, a stamp with a patterned stamp surface is brought into contact with a surface of a metal layer. As a result, a compound present at the stamp surface is transferred to the surface of the metal layer. This leads to the formation of a monolayer of said compound. Subsequently, the metal layer is etched, the monolayer being used as the etch mask. In this way, as well as in other ways, microcontact printing can be used to provide micron and submicron-size patterns, using a non-photolithographic technique and without clean room conditions being absolutely required. Frequently, aligning the stamps used for different layers poses a problem in microcontact printing. In the method in accordance with the invention, this problem is transferred to the assembly of the device, and hence is absent. Another problem encountered in microcontact printing is that generally sagging of the stamp takes place, unless otherwise functionless supports are present. In the method in accordance with the invention, these supports provide the adhesive spots in the pattern.

In this manner, the entire device can be manufactured without employing photolithographic techniques. The channel layer can be provided, for example, by means of ink jet printing, in particular if this layer comprises an organic material. After all, the patterns in the channel layer may be coarser than those in the electrode layers. The intermediate layer may be provided, for example, by means of phase separation on a modified surface, as mentioned in the non-prepublished application EP 01201655.6 (PHNL010318).

Preferably, use is made of foils supplied in a coil. Said foils are preferably provided with perforations. The use of a coil is favorable from the point of view of industrial production. A coil is very efficient as regards the supply of basic material. In addition, a coil can be used in a process where juxtaposed parts of the coil are subjected to successive process steps. After such a step, the coil is further unwound. Besides, the coil makes it possible to provide a flexible substrate with the firmness necessary for its provision by means of a support and by securing the coil. The coil also enables the spin-coating process, wherein much coating liquid is wasted, to be replaced by a different coating process, such as web coating or dip coating.

These and other aspects of the electronic device and the method in accordance with the invention are apparent from and will be elucidated with reference to the embodiment(s) described hereinafter.

Figure 1:
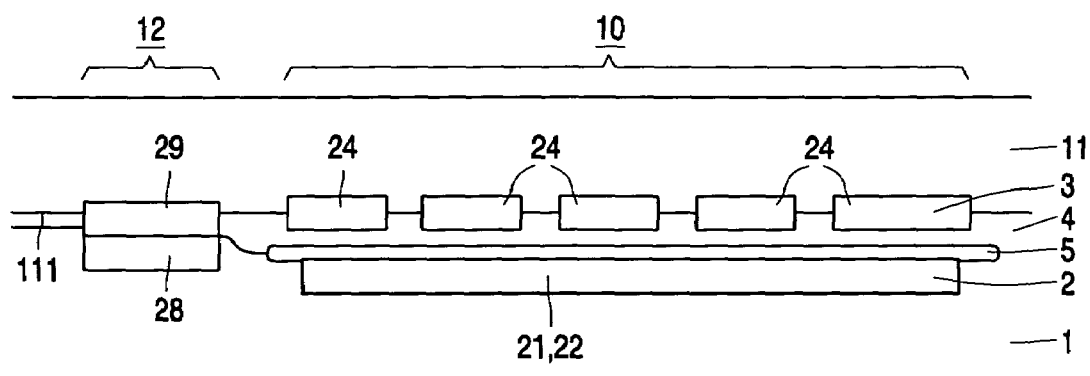
FIG. 1 shows a first embodiment of the device.

The Figures are diagrammatic representations, not to scale, of the device in accordance with the invention. In the Figures, only one specimen of a component, such as a thin-film transistor or a capacitor, is shown, while, in practice, a large number of such components are present. Like reference numerals refer to like parts.

The device shown in FIG. 1 is provided with a thin-film transistor 10 and, apart from a base substrate 1, an adhesive substrate 11. The base substrate 1 comprises a stack of a carrier layer, a protection layer and an isolation layer. The adhesive substrate 11 has a surface 111 of an organic material as, in this case, the entire adhesive substrate 11 is made of polyamide. The protection layer is, in this example, a layer of mono-aluminum phosphate comprising $TiO_2$ particles and TiN particles. Such particles provide for adequate shielding against visible light and infrared radiation. The carrier layer and the isolating layer comprise an isolating polymer, such as polyimide. Alternatively, the carrier layer and the isolating layer may comprise an inorganic material or an epoxy resin.

The first electrode layer 2 is present on the base substrate 1. Said electrode layer is made, in this case, of Au but it may alternatively also comprise carbon ink, aluminum, copper, TiN, or another electroconductive material. In this example, the source electrode 21, the drain electrode 22 and an intermediate channel 23 (represented as a single block in FIG. 1) are defined in the first electrode layer 2. Also a contact surface 28 is defined. On the first electrode layer 2 there is a channel layer 5 of the organic semiconductor material polythienylenevinylene. The channel layer 5 is patterned such that contact surface 28 in the first electrode layer 2 is exposed. The intermediate layer 4 of a photostructurable, organic dielectric material is provided on the channel layer 5. This material is, for example, a photoresist but may alternatively be a composition on the basis of epoxy, polyimide, polyvinylphenol, polyvinylalcohol, polyacrylate, as is known to persons skilled in the art. Furthermore, the intermediate layer may comprise an inorganic material, such as $SiO_2$, provided the channel layer or the surface of the base substrate comprises an organic material. Subsequently, the intermediate layer 4 is structured, causing the contact surface 28 in the first electrode layer 2 to become exposed in a resultant U shape.

The second electrode layer 3 of Au is present on the adhesive substrate 11. In the second electrode layer 3, the gate electrode 24 and a contact surface 29 are defined. The second contact layer 3 is in contact with the intermediate layer 4. Both the gate electrode 24 and the contact surface 29 are provided with openings. At the location of the openings, adhesion takes place between the adhesive substrate 11 and the intermediate layer 4.

Figure 2:
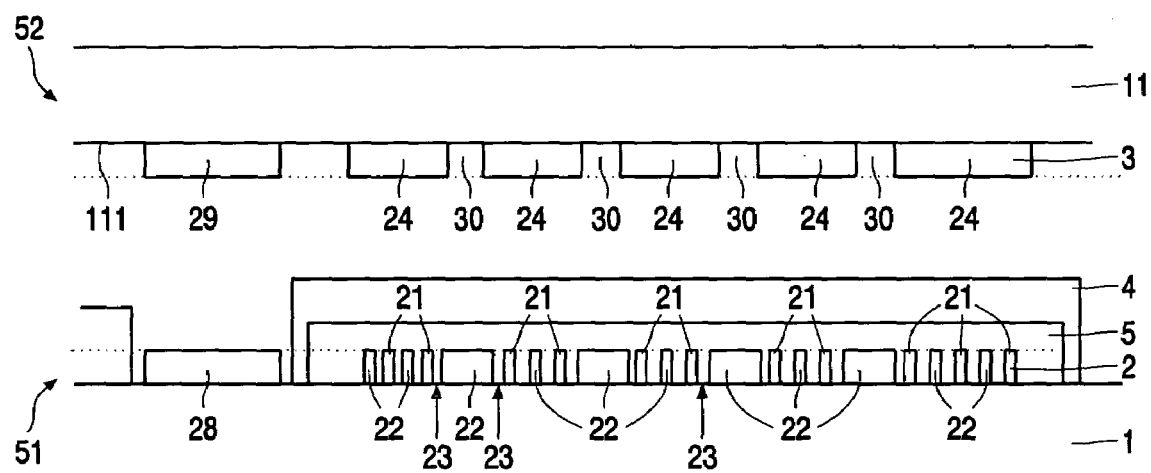
FIG. 2 shows the device of FIG. 1 before laminating together the first and the second half.

FIG. 2 shows a first half 51 and a second half 52 forming, after lamination, the device in accordance with the invention. The first half 51 comprises the base substrate 1, the first electrode layer 2 with an interdigitated pair of source electrode 21 and drain electrode 22 between which the channel 23 is interposed. The first half additionally comprises the channel layer 5 and the intermediate layer 4. The second half 52 comprises the adhesive substrate 11 and the second electrode layer 3. In the second electrode layer, a contact surface 29 and the gate electrode 24 are defined. Openings 30 are situated between parts of the gate electrode 24. Opposite the openings 30 there are broadened fingers of the drain electrode 22, so that the channel is nowhere opposite an opening 30. Although this is not shown in the drawing, said fingers of the drain electrode are overdimensioned with respect to the opening 30. As a result, a clearance of a few micrometers is maintained for aligning when the device is being laminated.

The device is laminated from the first and the second half 51, 52 by arranging the adhesive substrate 11 with the second electrode layer 3 on the intermediate layer 4. In this operation, the thin-film transistor 10 and a via 12 are formed. The via 12 comprises the contact surfaces 28, 29. To provide for sufficient adhesion, an aftertreatment is carried out at a temperature in the range from 80 to 140° C. In addition, an adhesive layer may be provided on the second electrode layer 3. Such an adhesive layer comprises, for example, a monolayer of a thiol. Correct alignment is achieved by defining aligning means 25, 26, shown in FIG. 3, 4, not in FIG. 2, in the first and the second electrode layers 2, 3. The thin-film transistor is locally exposed through the adhesive substrate 11 to check whether the aligning means are in the desired positions with respect to each other. For this purpose, the aligning means 25, 26 have, for example, complementary shapes.

Figure 3:
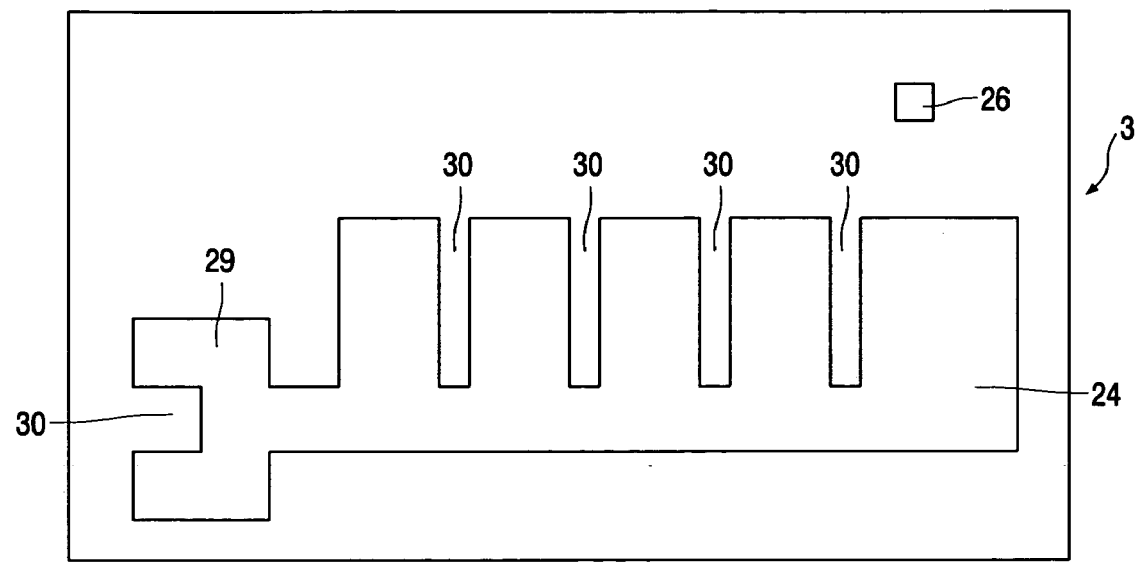
FIG. 3 is a diagrammatic plan view of the second electrode layer in the device.

FIG. 3 is a plan view of the second electrode layer 3. The gate electrode 24 is 100 micrometers by 35. The contact surface 29 is 30 micrometers by 20. The gate electrode 24 and the contact surface 29 each have openings 30 where the electrode layer 3 is removed. The opening 30 in the contact surface 29 is approximately 10 micrometers by 10.

Figure 4:
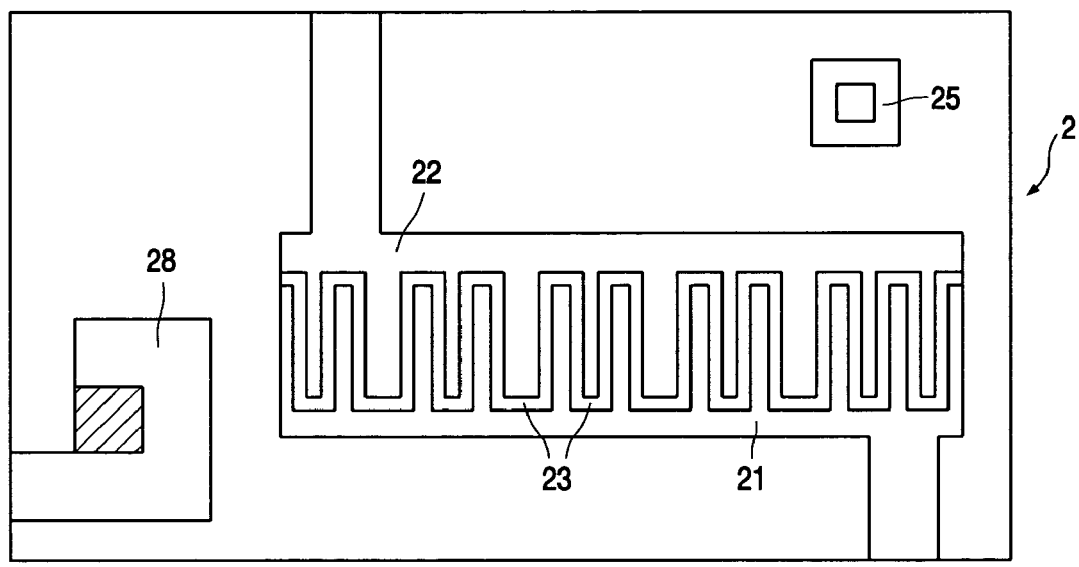
FIG. 4 is a diagrammatic plan view of the first electrode layer in the device.

FIG. 4 is a plan view of the first electrode layer 2. The source and drain electrode 21, 22 each have a finger-shaped "interdigitated" pattern between which the channel 23 extends. The first electrode layer 2 additionally comprises contact surface 28 and aligning means 25. The source and drain electrode 21, 22 jointly are 95 micrometers by 30. At the location of the openings in the gate electrode 24, the fingers of the drain electrode 22 are wider so as to ensure that the channel extends completely within the surface of the gate electrode 24 (at least a perpendicular projection thereof). The contact surface 28 is 15 micrometers by 30. The hatching within said contact surface 28 represents the part that is covered by the intermediate layer 4, or that may be removed if necessary. As the gate electrode 24 and the contact surface 29 in the second electrode layer 3 are overdimensioned, there is an amount of clearance of at least 5 micrometers in all directions during aligning the first and the second half 51, 52.

Figure 5:
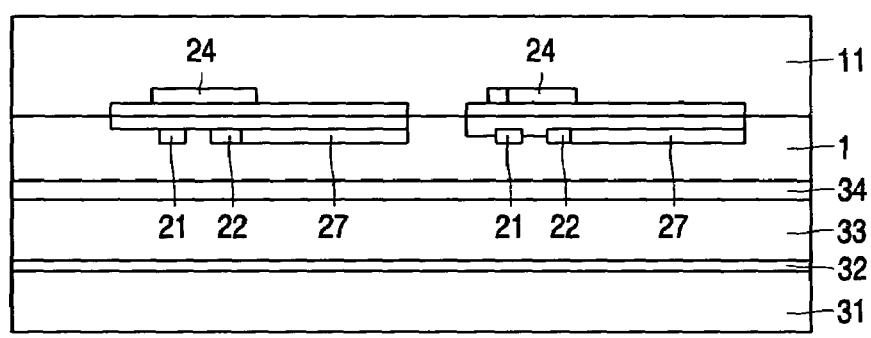
FIG. 5 shows a second embodiment of the device.

FIG. 5 shows a display device. The device is provided with thin-film transistors 10, which are situated between a base substrate 1 and an adhesive substrate 11. In this embodiment, the source electrodes and drain electrodes 21, 22 are present in the second electrode layer 3 at the adhesive substrate 11. This can be attributed to the fact that a picture electrode 27 having a surface area of 10 micrometers by 10 is connected to the drain electrode 22. Openings are defined in this picture electrode. Furthermore, the base substrate 1 is transparent, and the first and the second electrode layer 2, 3 comprise gold. The display device is additionally provided with a third substrate 31 of a transparent material. Between the third substrate 31 and the adhesive substrate 11 there are successively arranged a counter electrode 32 of indium tin oxide, which is provided on the third substrate 31, a layer 33 of a liquid crystalline material and orientation layers 34, as is known to persons skilled in the art.

Figure 6:
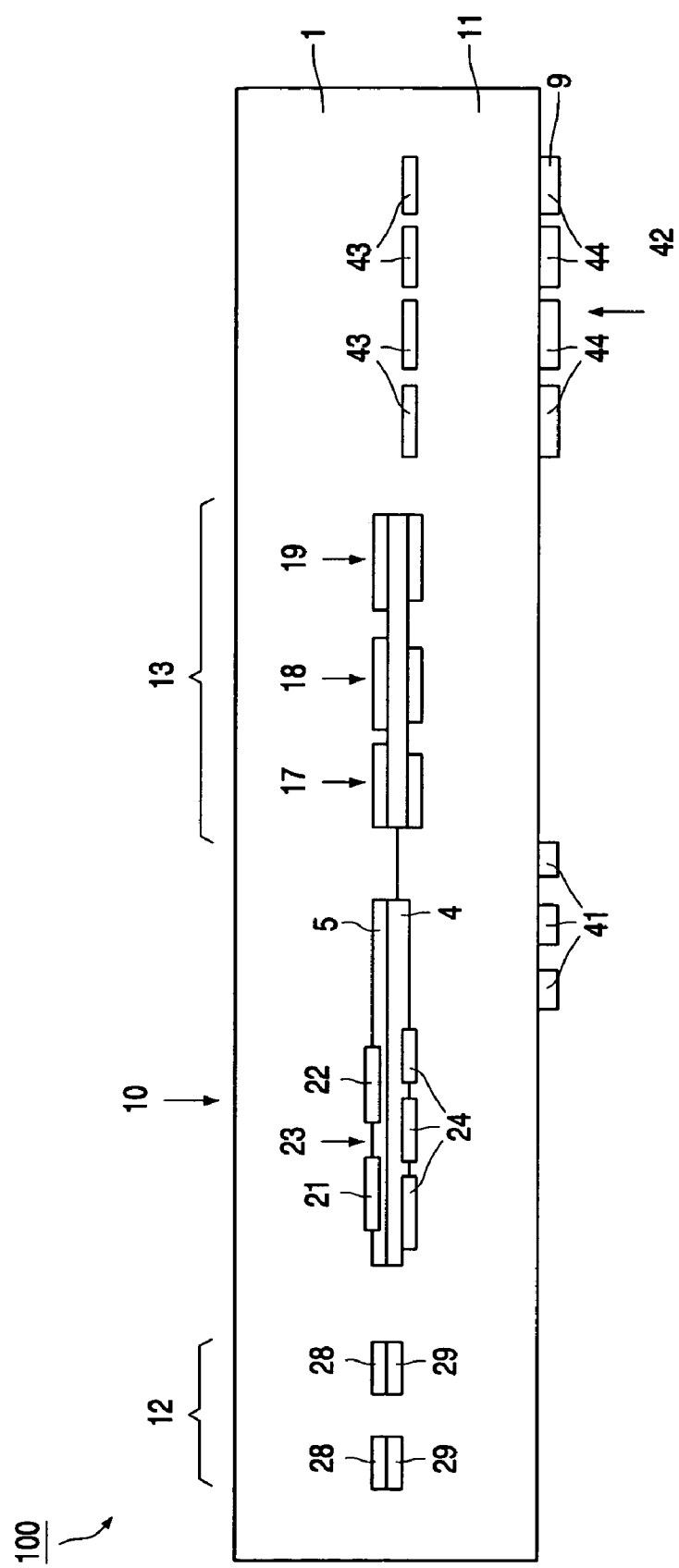
FIG. 6 shows a third embodiment of the device.
Figure 7:
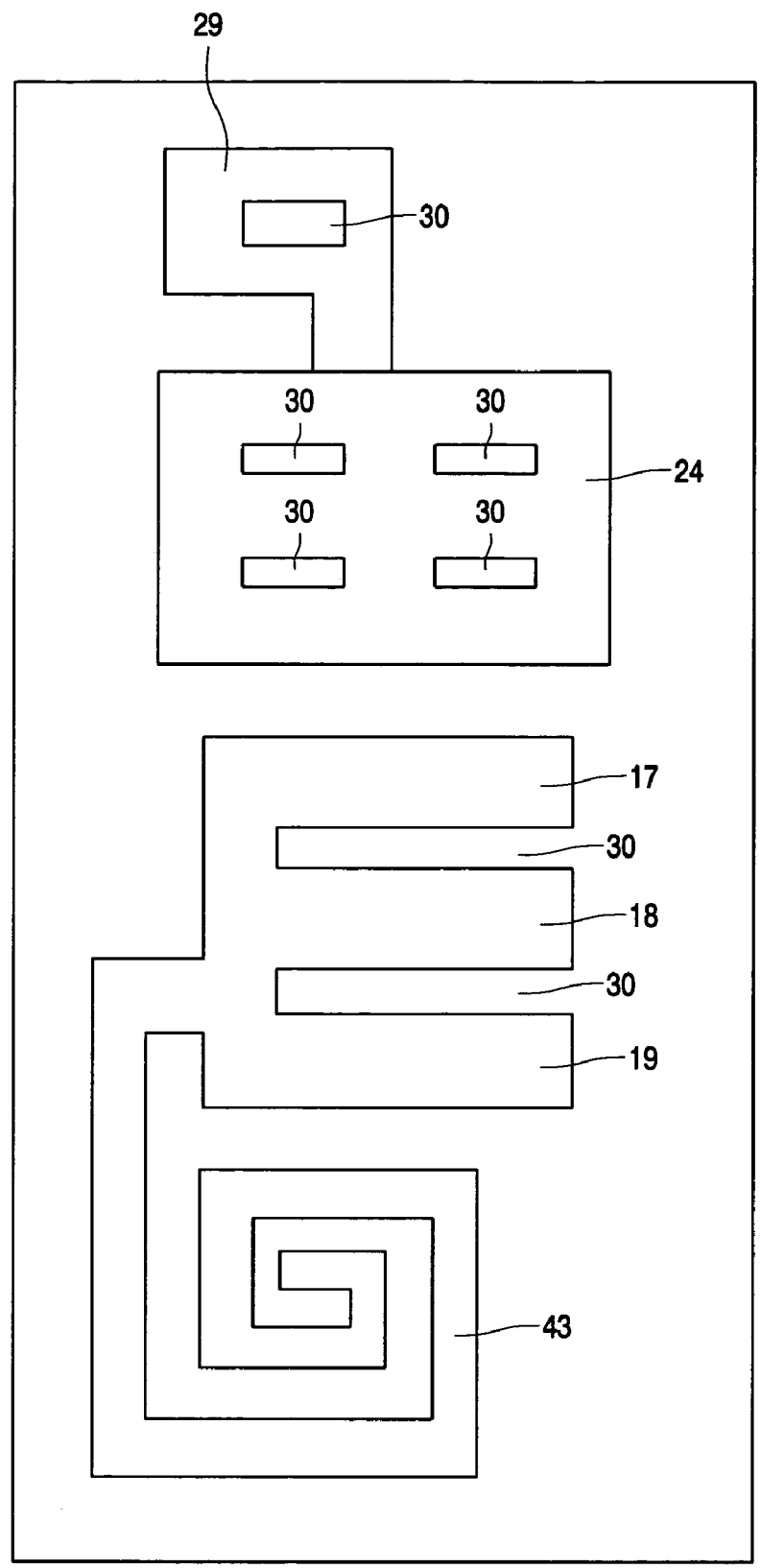
FIG. 7 shows a plan view of the second electrode layer in the device shown in FIG. 6.

FIG. 6 shows a transponder 100 in accordance with the invention, and FIG. 7 is a plan view of the second electrode layer 3 in the transponder 100. Apart from a thin-film transistor 10 and a via 12, the transponder 100 comprises a capacitor 13. The contact surface 29 in the via 12 as well as the gate electrode 24 of the thin-film transistor 10 and the electrode of the capacitor 13 are provided with openings. This capacitor 13 may be considered at the same time to be the assembly of three parallel-arranged capacitors 17, 18, 19. The capacitors 17, 18, 19 are designed such that the desired capacitance is obtained. At the same time, there is no surface that will be subject to delamination. As will be understood by those skilled in the art, the transponder 100 comprises various thin-film transistors 10 in practice, which jointly form an integrated circuit. The integrated circuit comprises, inter alia, an oscillator and a memory, as disclosed in, for example, WO-A 99/30432. Customarily, also various capacitors 13 and vias 12 are present, and the first and the second electrode layers have interconnect tracks interconnecting vias 12, capacitors 13 and thin-film transistors 10. In addition, the transponder 100 in this example is provided with a contact layer 9 that is situated on the second substrate 11. For this purpose, use is made of a substrate 11 that is metallized on two sides. The contact layer 9 comprises an antenna 41 which, in this example, is embodied so as to be a coil. Alternatively, the antenna 41 may comprise two capacitor electrodes for capacitive coupling to a base station. To connect the antenna 41 to the electrode layers 2, 3, a coil 42 having two turns 43, 44 is used. Alternatively, an electroconductive connection from the second electrode layer 3 to the contact layer 9 may be present. Such a connection may be formed by holes in the adhesive substrate 11, but may alternatively be obtained by folding in two an end portion of the adhesive substrate 11. As the metal of the second electrode layer 3 does not adhere to the intermediate layer 4, the end portion of the adhesive substrate 11 may be loose, if desired, and be folded subsequently. The folded portion can be bonded using an adhesive or a temperature treatment.

EXAMPLE 1

A base substrate 1 of polyethylene terephtalate that is provided, on one side, with a 20 nm thick layer of Au is provided on a carrier. A partial vacuum is used to make sure that the base substrate 1 is horizontally arranged on the carrier. The base substrate 1 is mechanically fixed in position. Subsequently, a photoresist is provided and exposed, via a mask, in accordance with a desired pattern. Said desired pattern comprises source electrode 21, drain electrode 22 and channel 23. The photoresist is developed, after which the first electrode layer 2 of Au is etched in known manner. Said Au is cleaned. Subsequently a channel layer 5 of a sulphide precursor of polythienylene vinylene is provided. The layer 5 is dried. Said layer is provided with an intermediate layer 4 of the photoresist HPR504. This photoresist is exposed in accordance with a desired pattern. The uncovered part of the layer of the sulphide precursor is removed by dissolving it. By heating in the presence of a catalytic quantity of an acid, the sulphide precursor is converted to the semiconductor material polythienylene vinylene. Subsequently, another layer of the photoresist HPR504 is provided by means of spin coating. This layer is subsequently provided with a desired pattern. This pattern essentially corresponds to the pattern of the organic semiconductor, with the exception of any defined capacitors. Alternatively, a photosensitive acidifier, such as diphenyl iodonium hexaarsenate, may already be added to the sulphide precursor. After spin coating, the part of the layer to be converted to polythienylene vinylene is exposed to deep UV. Subsequently, the channel layer is heated to 130° C. At locations where no acid has been formed, conversion does not take place. At locations where acid has been formed, conversion does take place. The non-converted part is subsequently removed by washing using a suitable solvent, such as chloroform.

An adhesive substrate 11 of polyethylene terephtalate that is provided, at a surface 111, with a 20 nm thick Au layer is provided on a carrier. A partial pressure is used to make sure that the adhesive substrate 11 is horizontally arranged on the carrier. The adhesive substrate 11 is fixed mechanically. Subsequently, a photoresist is provided and exposed in accordance with a desired pattern via a mask. The photoresist is developed, after which the layer of Au is etched in known manner. The Au is cleaned.

The adhesive substrate 11 is subsequently provided on the base substrate 1 in such a manner that the layers of Au face each other. In this process optical alignment takes place. The first and the second electrode layer 2, 3 are aligned with respect to each other by means of aligning means defined in these layers 2, 3. For the aligning means use is made, inter alia, of the openings 31. Subsequently, said parts forming the assembly are pressed together and heated to 100 degrees Celsius.

EXAMPLE 2

A base substrate 1 of polyimide with a 150 nm thick layer of Au is provided, as described in example 1, on a carrier on which a 5 nm thick adhesive layer of Ti is present already.

The first electrode layer 2 of Au is provided with a monolayer of octadecyl thiol by means of microcontact printing, as disclosed in U.S. Pat. No. 5,817,242. The monolayer serves as a mask, and the Au layer is patterned using an etch of an $I_2$/KI solution. Subsequently, an etch of 1.5 M $H_2O_2$ and 2.5 M $(NH_4)_2HPO_4$ having a pH between 7 and 10 is used to pattern the Ti layer at 40° C. In this process, said $(NH_4)_2HPO_4$ serves as a buffer. The etching rate is approximately 5 nm/min., dependent on the concentration of the $H_2O_2$. It was found that for details ranging in size between 0.5 and 2000 μm and for Ti/Au stacks of varying thicknesses underetching of Ti does not take place. The monolayer is removed by cleaning in ethanol.

The surface of the patterned electrode layer 2 of Au is modified in accordance with a desired pattern by applying a monolayer of $HS(CH_2)_{18}OH$. For this purpose use is made of a stamp that is suitable for contact printing and that is made of PDMS and provided with a patterned stamp surface. To apply the monolayer, the stamp is impregnated at the stamp surface with a solution of $HS(CH_2)_{18}OH$ in ethanol. The desired pattern of a via is defined as the negative; the entire surface is provided with the monolayer except for the vias. These vias are square and have a surface area of 64 $μm^2$. Subsequently, a solution of octadecyl thiol, $HS(CH_2)_{17}CH_3$ is applied to the substrate provided with the metal layer and the monolayer. As a result, the hitherto uncovered part of the surface of the layer of gold is covered with a second monolayer. To remove any remaining octadecyl thiol, a rinsing operation using ethanol is carried out. Subsequently, a composition of a first polymer and a second polymer in a solution is provided by spin coating. The first polymer is polystyrene with an Mw of 90900 and Mw/Mn=1.05. The second polymer is poly(2-vinylpiridine) with an Mw of 115000 and Mw/Mn=1.03. The solvent is tetrahydrofuran. For spin coating use is made of a Karl Süβ RC8 spin coater with Gyrset (open lid: 1000 rpm, 200 rpm/s, 5 s., closed lid: 3000 rpm, 1000 rpm/s, 10 s.). The composition comprises 0.75% by weight of the polystyrene and 0.75% by weight of polyvinylpiridine. The composition additionally comprises 250 mg/L 2.6-di-tert-butyl-4-methylphenol to stabilize the solvent. The temperature is 21+/−0.5 degrees centigrade, the relative air humidity is 50+/−5%. The composition provided by means of spin coating is dried while spinning under "closed lid" conditions. This causes the composition to be decomposed into a first and a second sub-layer. The first sub-layer with the first polymer, i.e. polystyrene, precipitates selectively on the monolayer of octadecyl thiol. The second sub-layer with the second polymer, i.e. poly(2-vinylpiridine), precipitates on the monolayer of octadecyl thiol. By rinsing three times with cyclohexane as the first etchant, the first sub-layer is removed. The second sub-layer serves as the intermediate layer. The channel layer 5 is provided by means of ink jet printing.

The adhesive substrate 11 of polyimide with a second electrode layer 3 of Au at the surface 111 is provided on a carrier, as described in example 1. The layer 3 is patterned by means of microcontact printing, as described hereinabove. The device is assembled in the manner described hereinabove.

The invention claimed is:
1. An electronic device comprising
   a base substrate provided with a surface at which a first electrode layer of a metal is present,
   a channel layer of a semiconductive material;
   an intermediate layer of a dielectric material, and an adhesive substrate provided with a surface of an organic material at which a second electrode layer of a metal is present, in which electrode layers, channel layer and intermediate layer a thin-film transistor is defined, which electronic device can be obtained by laminating together the substrates provided with layers, characterized in that the second electrode layer comprises a conductive surface and the conductive surface has an opening where adhesion occurs between the organic material at the surface of the adhesive substrate and an organic material of one of the layers chosen from intermediate layer, channel layer and surface of the base substrate.

2. An electronic device as claimed in claim 1, characterized in that a source and a drain electrode are defined in the first electrode layer, which source electrode and drain electrode are separated by a channel that is filled with the channel layer, and the conductive surface in the second electrode layer is defined as the gate electrode.

3. An electronic device as claimed in claim 2, characterized in that the source and the drain electrode in the first electrode layer are an interdigitated electrode pair, and the gate electrode is overdimensioned with respect to the interdigitated electrode pair.

4. An electronic device as claimed in claim 1, characterized in that the first electrode layer comprises a contact surface, a projection of the conductive surface in the second electrode layer on the first electrode layer overlapping with the contact surface in the first electrode layer;

the channel layer and the intermediate layer are at least substantially absent at the location of the contact surfaces, so that both surfaces are electroconductively interconnected and define a via.

5. An electronic device as claimed in claim 1, characterized in that the first and the second electrode layer each comprise an isolated track for aligning the first and the second electrode layer in the course of laminating the device.

6. An electronic device as claimed in claim 1, characterized in that the substrates are foils of a polymeric material.

7. A method of manufacturing an electronic device as claimed in claim 1, characterized in that prior to the lamination of the semiconductor device, the base substrate and the adhesive substrate form part of an encapsulating layer, lamination of the device taking place by folding the encapsulating layer in two.

8. A method as claimed in claim 7, or a method of manufacturing an electronic device as claimed in claim 1, characterized in that the first and the second electrode layer are patterned by means of microcontact printing.

9. An electronic device as claimed in claim 1, characterized in that a capacitor is present comprising a first and a second electrode and a dielectric, the first electrode is situated in the first electrode layer, the second electrode is situated in the second electrode layer and comprises openings where adhesion takes place between the organic material at the surface of the adhesive substrate and the organic material of one of the layers chosen from the intermediate layer, the channel layer and the surface of the base substrate.

10. An electronic device as claimed in claim 1, characterized in that the first and the second electrode layer are the only layers of electroconductive material in an encapsulation comprising the adhesive substrate and the base substrate.

* * * * *